United States Patent
Kinoshita

(10) Patent No.: US 7,432,115 B2
(45) Date of Patent: Oct. 7, 2008

(54) TEST CIRCUIT, SEMICONDUCTOR PRODUCT WAFER HAVING THE TEST CIRCUIT, AND METHOD OF MONITORING MANUFACTURING PROCESS USING THE TEST CIRCUIT

(75) Inventor: Eita Kinoshita, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 11/808,861

(22) Filed: Jun. 13, 2007

(65) Prior Publication Data

US 2007/0244593 A1    Oct. 18, 2007

Related U.S. Application Data

(62) Division of application No. 10/989,355, filed on Nov. 17, 2004, now abandoned, which is a division of application No. 10/115,972, filed on Apr. 5, 2002, now Pat. No. 6,836,133.

(30) Foreign Application Priority Data

Apr. 5, 2001    (JP) ............................. 2001-107518

(51) Int. Cl.
H01L 21/00    (2006.01)

(52) U.S. Cl. .......................... 438/14; 438/17; 700/108; 324/765

(58) Field of Classification Search .................. 438/14, 438/17; 700/108; 324/765
See application file for complete search history.

(56) References Cited

U.S. PATENT DOCUMENTS

| | | | |
|---|---|---|---|
| 3,983,479 A | 9/1976 | Lee et al. | |
| 4,701,919 A | 10/1987 | Naitoh et al. | |
| 4,719,411 A | 1/1988 | Buehler | |
| 4,801,869 A | 1/1989 | Sprogis | |
| 5,059,899 A | 10/1991 | Farnworth et al. | |
| 5,329,228 A | 7/1994 | Comeau | |
| 5,485,095 A | 1/1996 | Bertsch et al. | |
| 5,514,974 A | 5/1996 | Bouldin | |
| 5,654,582 A | 8/1997 | Kijima et al. | |
| 6,400,173 B1 * | 6/2002 | Shimizu et al. | 324/765 |
| 6,707,064 B2 | 3/2004 | Jang et al. | |
| 6,727,723 B2 * | 4/2004 | Shimizu et al. | 324/765 |
| 6,747,471 B1 | 6/2004 | Chen et al. | |
| 6,823,485 B1 * | 11/2004 | Muranaka | 714/719 |
| 6,836,133 B2 * | 12/2004 | Kinoshita | 324/765 |

(Continued)

FOREIGN PATENT DOCUMENTS

JP    A 2002-110753    4/2002

OTHER PUBLICATIONS

T. Hamamoto et al., "Measurement of Contact Resistance Distribution Using A 4k Contacts Array", Proc. IEEE, Int. Conference on Microelectronic Test Structures, vol. 8, pp. 57-60, 1995.

Primary Examiner—Laura M Schillinger
(74) Attorney, Agent, or Firm—Oliff & Berridge, PLC

(57) ABSTRACT

A test circuit and a method of monitoring a manufacturing process of a semiconductor integrated circuit using the test circuit are provided. The test circuit comprises elements to be tested; a selection circuit for sequentially selecting at least one of the elements at a time. The test circuit and pads used for testing the elements are placed within a scribe line on a semiconductor wafer.

6 Claims, 8 Drawing Sheets

U.S. PATENT DOCUMENTS

| | | | |
|---|---|---|---|
| 6,838,869 B1 * | 1/2005 | Rogers et al. | 324/158.1 |
| 2002/0145442 A1 * | 10/2002 | Kinoshita | 324/765 |
| 2002/0171449 A1 * | 11/2002 | Shimizu et al. | 324/765 |
| 2005/0090922 A1 * | 4/2005 | Kinoshita | 700/108 |
| 2006/0221735 A1 | 10/2006 | Matsumoto | |
| 2007/0244593 A1 * | 10/2007 | Kinoshita | 700/108 |

* cited by examiner

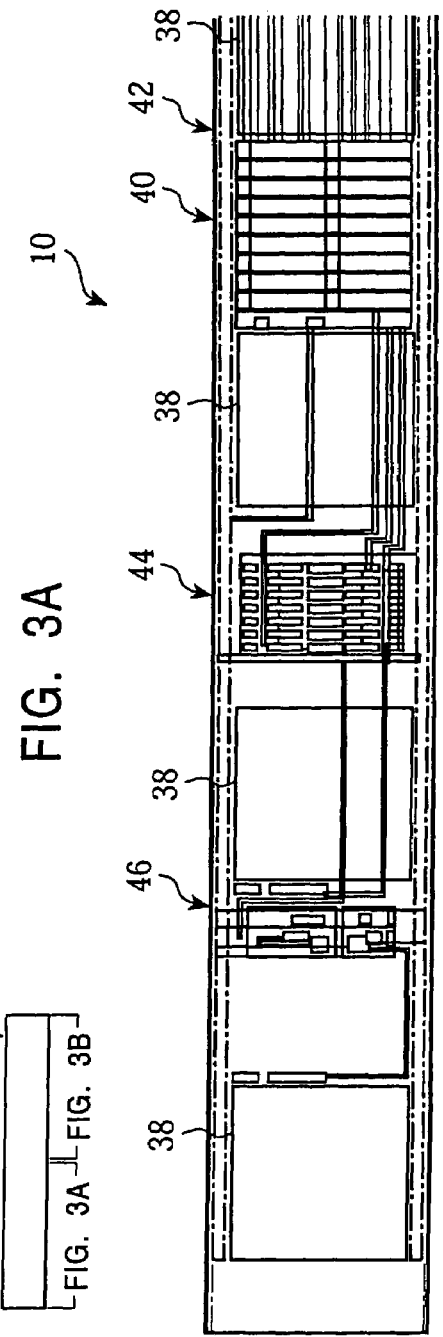
FIG. 3A
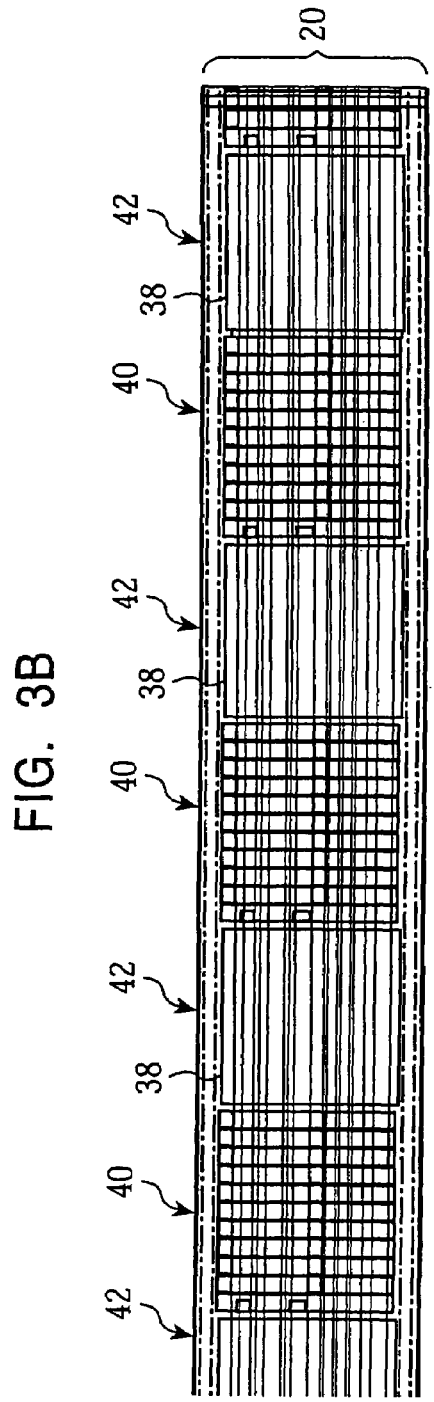
FIG. 3B
FIG. 3C

TEST CIRCUIT, SEMICONDUCTOR PRODUCT WAFER HAVING THE TEST CIRCUIT, AND METHOD OF MONITORING MANUFACTURING PROCESS USING THE TEST CIRCUIT

This is a Division of application Ser. No. 10/989,355 filed Nov. 17, 2004, which in turn is a Division of application Ser. No. 10/115,972 filed Apr. 5, 2002. The disclosure of the prior applications is hereby incorporated by reference herein in its entirety.

BACKGROUND OF THE INVENTION

1. Field of Invention

This invention relates to a test circuit, a wafer having the test circuit within a scribe line of the wafer. This invention also relates to a method, using the test circuit, of monitoring of or conducting defect analysis in a manufacturing process of semiconductor integrated circuits.

2. Description of Related Art

To produce semiconductor integrated circuits, a manufacturing process (wafer process) processes semiconductor substrates (wafers). The manufacturing process includes a large number of process steps. When the wafer process is completed, the wafer becomes a product wafer having a plurality of semiconductor integrated circuit chips (product chips) formed in respective chip areas on the wafer. The chips are, then, separated into individual dies at scribe lines between the chip areas. The dies are, then, packaged to become semiconductor integrated circuit products.

The chip areas are arranged on the wafer in rows and columns. Each of the scribe lines has a shape of a stripe having a constant width. The scribe lines cross with each other to form a shape of a grid. The width of the scribe line should be sufficient large so that the product chips can be easily separated. At the same time, the scribe line should be as narrow as possible to increase the number of product chips produced on a wafer. Typically, the scribe line has the width 100 to 150 μm.

Test circuits that allow easy and convenient measurement of characteristics of various elements are also formed on the wafer simultaneously with the manufacturing of the product chips. When the wafer process is completed, the product chips are tested before the separation to determine whether each of the product chips functions as required by the specification of the product. At this time, at least some of the test circuits formed on the wafer are also tested to measure the characteristics of the elements and/or to analyze the cause of faults of the product chips.

The result of the test of the test circuit is used to monitor the state of the manufacturing process. That is, for example, if abnormal characteristics are measured, the manufacturing process is checked to determine the cause of the abnormality. The process is adjusted to prevent further occurrence of the abnormality. In addition, when an abnormality is found by the test of the product chips, for example, a yield of the product chips lower than a normal range is found, the test circuits are extensively tested to determine the cause of the abnormality.

FIG. 7A is a circuit diagram illustrating a test circuit 100 of a first conventional example. In the test circuit 100 shown, resistor elements 102, such as contacts between source/drain regions and wires or vias between wires in different wiring layers, are connected in series. The resistance value of the resistor elements 102, such as contacts or vias, is determined from the current flowing through the elements 102 and the potential between pads 104 at both ends of the serially connected resistor elements 102.

Such a configuration is generally referred to as a "contact chain" or "via chain", and is most frequently used for monitoring manufacturing processes.

FIG. 7B is a circuit diagram illustrating a test circuit 110 of a second conventional example. The test circuit 110 is used for a measuring method called a four-probes method in which four terminals 114, two connected to each end of one resistor element 112, are used. That is, a current is supplied to the resistor element 112 such as a contact or a via, and the potential difference between both ends of the element is measured. Thereby the resistance value can be measured accurately.

These test circuits 100 and 110 have a simplified circuit configuration and use a simplified test methodology, and also require a smaller number of test pads for inputting/outputting signals to/from external measuring equipment. Thereby, the area of the test circuit can be reduced. The test circuit of these conventional examples, therefore, is often formed in the scribe line.

Such an arrangement can eliminate the need for forming the test circuit in the chip area, thereby saving the space available for the product chip. As a result, a number of product chips that can be produced per wafer is increased and the fabrication cost is minimized.

The test circuits of those conventional examples, however, have the following drawbacks.

First, the test circuit 100 of the first conventional example shown in FIG. 5A includes a large number of resistor elements 102 (contacts or vias) arranged in the form of a chain. This arrangement increases the detection sensitivity to an increase in the resistance values of the resistor elements 102 (contacts or vias) when the resistance values of the entire contacts or vias similarly increase.

When the resistance value of only one or a small number of the contacts (or vias) is increased, however, the resistance of the chain hardly increases unless the increase is significant relative to the resistance of the entire chain. Therefore, it is often impossible to detect the increase of the resistance of one or a small number of the contacts (or vias) in the chain.

For example, when the chain includes one hundred resistor elements 102, even if the resistance of one of the resistor elements 102 becomes ten times the value of the other normal resistor elements 102, the resistance of the entire chain becomes merely 109% relative to the normal case. Such increase in the resistance may be regarded as being normal. Thus, merely monitoring the resistance of the entire chain cannot provide a measurement that can be used to detect the abnormality in one or a small number of the contacts (or vias). That is, this type of test circuit has difficulty in detecting a defect in which, for example, the resistance values of only a small fraction of contacts (or vias) are increased.

In fact, in a semiconductor integrated circuit manufacturing process, defects that present abnormalities in only a small fraction of the contacts (or vias) frequently occur. In such cases, a decrease of the yield of the product chips occurs even when the chain resistance falls within a range that is determined to be normal. When the fraction of contacts or vias with the increased resistant is increased to such a degree that the resistance of the chain becomes abnormal, the yield of the chips is drastically reduced in many cases.

Such a tendency has become more pronounced as the minimum feature size of the semiconductor integrated circuit decreases. Accordingly, the test circuit of the first conventional example cannot be satisfactory used in monitoring a semiconductor integrated circuit manufacturing process.

On the other hand, the test circuit 110 of the second conventional example, as shown in FIG. 7B, is suitable to measure the resistance of one resistor element 12, such as a contact (or via). However, it requires four terminals 114 to measure the resistance value of one resistor element 112 and thus requires the same number of pads. Each test pad is typically has a rectangular shape having a size of about 50 to 100 μm on a side. Therefore, arranging only the four pads necessary to measure the resistance of only one resistor element 112 requires a large area.

Thus, for collecting an amount of measurement data sufficient to establish a correlation with the yield of produced chips a large area is needed to arrange a large number of test circuits 110. The test circuit 110, therefore, cannot be realistically used in detecting defects, such as an increase in the resistance of a small fraction of contacts (or vias).

Further, as will be explained in detail later, another test circuit is proposed in a paper presented at ICMTS (International Conference on Microelectronic Test Structures), Vol.8, pp. 57, March 1995, which is incorporated herein by reference in its entirety. In this third conventional example, a large number of elements to be tested, such as contacts, are arranged in the form of an array. Resistance values of individual elements can be measured and evaluated by using a counter, a decoder, and switches.

A similar test circuit is also disclosed in U.S. Pat. No. 4,719,411, which is incorporated herein by reference in its entirety.

However, the size of the third conventional example is large, and is impossible to place in a scribe line on a wafer. Accordingly, the test circuit cannot be placed in a chip area that is otherwise supposed to be allocated to place a product chip. Therefore, the third conventional example can not be suitably used for monitoring a semiconductor manufacturing process.

SUMMARY OF THE INVENTION

To overcome the foregoing problems of the related art, a first object of this invention is to provide a test circuit that may be advantageously utilized to monitor a manufacturing process. The test circuit allows detection of an abnormality in a fraction of a large number of elements to be tested. The test circuit includes a pad used for testing the elements that has a dimension suitable to be placed within a scribe line on a semiconductor wafer.

A second object of this invention is to provide a semiconductor product wafer having the test circuit.

A third object of this invention is to provide a method of monitoring a manufacturing process using the test circuit.

To achieve the first object, according to an aspect of this invention a test circuit is provided on a surface of a semiconductor wafer having a plurality of chip areas for placing semiconductor product chips and scribe lines between the chip areas. The test circuit comprises: a plurality of elements to be tested; a selection circuit that sequentially selects at least one of the elements at a time; and a plurality of pads used for testing the elements. The test circuit and the pads are placed within one of the scribe lines.

Similarly, according to another aspect of this invention a semiconductor product wafer is provided that comprises a plurality of product chips placed within respective chip areas arranged on a surface of the semiconductor product wafer and a test circuit. The test circuit comprises: a plurality of elements to be tested; a selection circuit that sequentially selects at least one of the elements at a time; and a plurality of pads used for testing the elements. The test circuit and the pads are placed within one of scribe lines that separate the chip areas.

Preferably, the plurality of pads comprise at least three pads arranged along a longitudinal direction of one of the scribe lines; and the plurality of elements are divided into at least two groups, each including at least two elements. At least two of the groups of elements are separately arranged in respective spaces between adjacent ones of the at least three pads.

Alternatively, the test circuit comprises: a plurality of elements to be tested; and a shift register including a plurality of shift stages, each for selecting a predetermined number of the elements. Each of the shift stages of the shift register and the predetermined number of the elements that can be selected by each of the shift stages are arranged along a direction generally perpendicular to a longitudinal direction of one of the scribe lines to form a unit. The unit has a dimension that can be placed within one of the scribe lines. The test circuit includes at least one block, each comprising a plurality of the units arranged along the. longitudinal direction of one of the scribe lines.

According to another aspect of this invention, a method of monitoring a manufacturing process for manufacturing semiconductor product wafers is provided that comprises manufacturing semiconductor product wafers by the manufacturing process. Each of the product wafers comprises: a plurality semiconductor product chips placed in respective chip areas arranged on a surface of the semiconductor product wafer; and a test circuit placed within one of scribe lines between the chip areas. The test circuit comprises a plurality of elements to be tested and a selection circuit that sequentially selects at least one of the elements at a time. The method of monitoring a manufacturing process further comprises: testing each of the elements in the test circuit in at least one of the manufactured semiconductor product wafers; and evaluating results of the testing to monitor the manufacturing process.

Similarly, according to another aspect of this invention, a method of monitoring a manufacturing process for manufacturing semiconductor product wafers is provided that comprises manufacturing semiconductor product wafers including different types of semiconductor product wafers at an arbitrary ratio in an arbitrary order by the manufacturing process. Each of the different types of semiconductor product wafers comprises: a plurality of one of different types of product chips placed in respective chip areas arranged on a surface of the semiconductor product wafer; and a common test circuit placed within one of scribe lines between the chip areas. The common test circuit comprises a plurality of elements to be tested and a selection circuit that sequentially selects at least one of the elements at a time. The method of monitoring a manufacturing process further comprises: selecting a plurality of the manufactured semiconductor product wafers comprising at least two of the different types of the semiconductor product wafers; testing each of the elements in the test circuit in the selected semiconductor product wafers; and evaluating results of the testing to monitor the manufacturing process.

Further, according to another aspect of this invention, a method of monitoring a manufacturing process for manufacturing semiconductor product wafers is provided that comprises manufacturing semiconductor product wafers, each including a plurality of product chips and a test circuit. The test circuit comprises a plurality of elements to be tested and a selection circuit that sequentially selects at least one of the plurality of elements at a time. The method of monitoring a manufacturing process further comprises: testing each of the elements in the test circuit in at least one of the manufactured semiconductor product wafers; evaluating results of the testing; and adjusting the manufacturing process according to the results of the evaluating to prevent occurrence of a decrease in a yield of the product chips.

BRIEF DESCRIPTION OF THE DRAWINGS

FIGS. 3A and 3B are layouts schematically illustrating part of the test circuit of the first embodiment, in which the test circuit blocks and the wiring blocks, which have the layout pattern shown in FIG. 2, are provided in a scribe line;

FIG. 3C illustrates the arrangement of the parts of the test circuit shown in FIGS. 3A and 3B in a test circuit according to the first embodiment;

DETAILED DESCRIPTION OF EXEMPLARY EMBODIMENTS

This invention was first described in Japanese Patent Application No. 2001-107518, which is herein incorporated by reference in its entirety.

Before explaining the test circuit according to this invention, additional explanation of the third conventional explained will be given.

Figure 8:
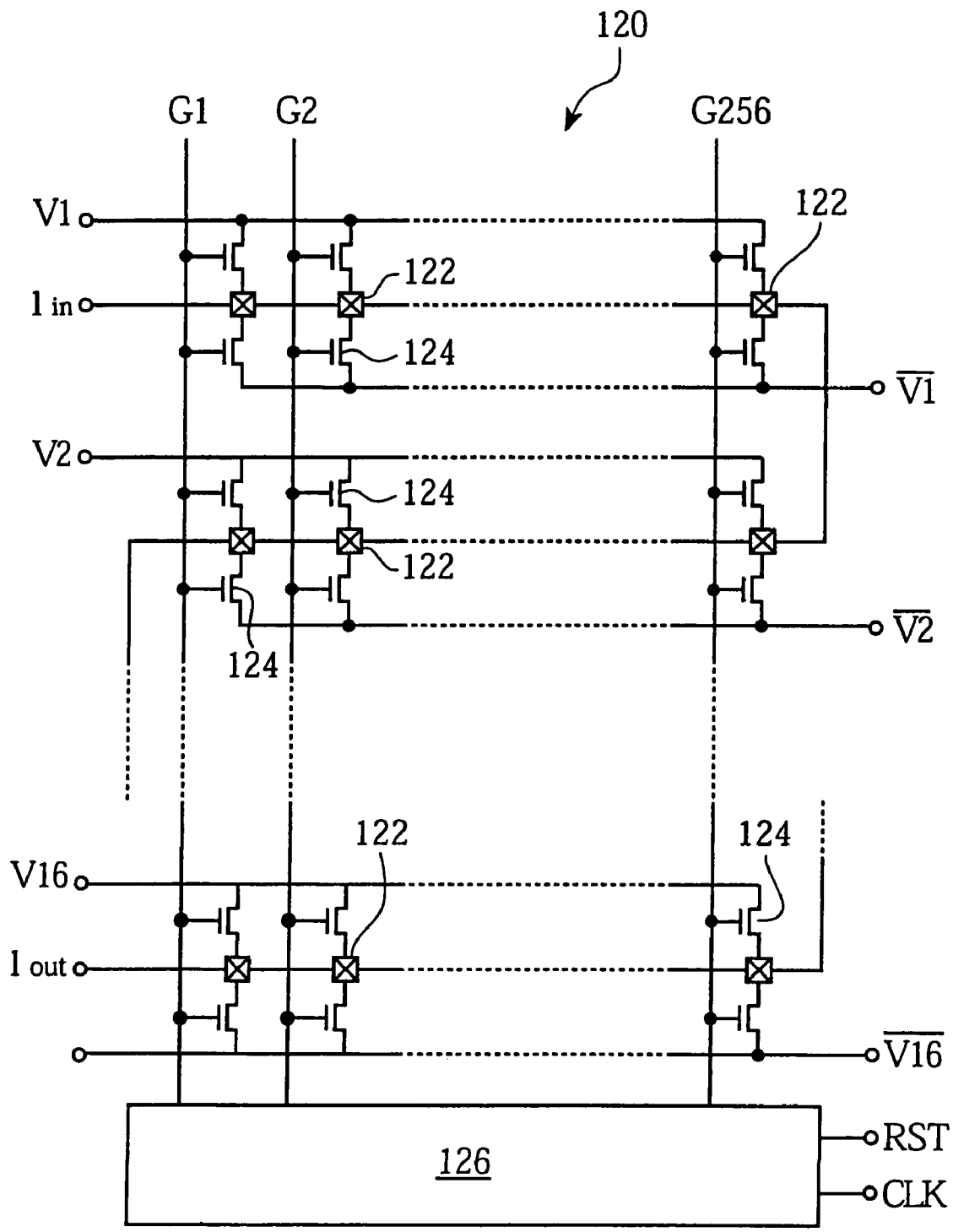
FIG. 8 is a circuit diagram of the third conventional test circuit.

FIG. 8 is a circuit diagram illustrating a test circuit 120 of a third conventional example. A large number of elements 122 to be tested, such as contacts (or vias), are arranged in the form of an array (256 columns×16 rows=4,096 four-terminal cross-contacts array), so that resistance values of the individual elements 122 can be measured and evaluated.

In the test circuit 120, the elements 122, such as contacts (or vias), are connected such that a series chain is formed. When measuring the resistance of the elements 122, a current is first supplied between a current source Iin at one end of the chain and a current source Iout at the other end of the chain. The potential across both ends of each elements 122 is then measured by connecting the both ends to a pair of potential difference measurement lines Vi and $\overline{Vi}$ (i=1 to 16) by switches (pass-transistors) 124. And the potential difference is measured, thereby allowing the measurement of the resistance of each element 122.

A (8-bit) binary counter and a (256-bit CMOS) decoder 126 connected to the counter selectively activate one of gates G1 to G256 to measure the resistance of the contact (or via) of interest.

The test circuit 120 is primarily intended to evaluate the "distribution" of the resistance values of the elements 122.

According to the description in the ICMTS paper, arranging a chain of one type of contacts (or vias) and the decoder for managing the measurement of the contacts requires an area of 2.3 mm×0.3 mm. In addition, the test circuit 120 requires the arrangement of pads and the binary counter (the decoder and the binary counter are collectively indicated at 126 in FIG. 8). Thus, it is impossible to arrange the test circuit 120 within a scribe line, typically having a width of 100 μm to 150 μm, on a semiconductor wafer. Accordingly, there is no other way but to arrange the test circuit by using areas that are otherwise supposed to be allocated to semiconductor integrated circuit product chips (chips areas).

Similarly, the test circuit disclosed in U.S. Pat. No. 4,719, 411 includes a large number of elements connected in series. And the individual elements are selected by a selection circuit to allow for measurement of the characteristic of the individual elements. However, the test circuit is provided in a chip area that is otherwise used to place a semiconductor integrated circuit product chip. Actually, the test circuit does not have a size that can be placed within a scribe line.

Thus, neither the test circuit of the third conventional example or the test circuit described in U.S. Pat. No. 4,719, 411 is suitable as a monitor for managing a manufacturing process of semiconductor integrated circuits.

Now, a test circuit suitable for monitoring a manufacturing process of semiconductor integrated circuits and a method for monitoring a manufacturing process of semiconductor integrated circuits according to this invention will be described in detail in conjunction with an exemplary embodiment with reference to the accompanied drawings.

Figure 1:
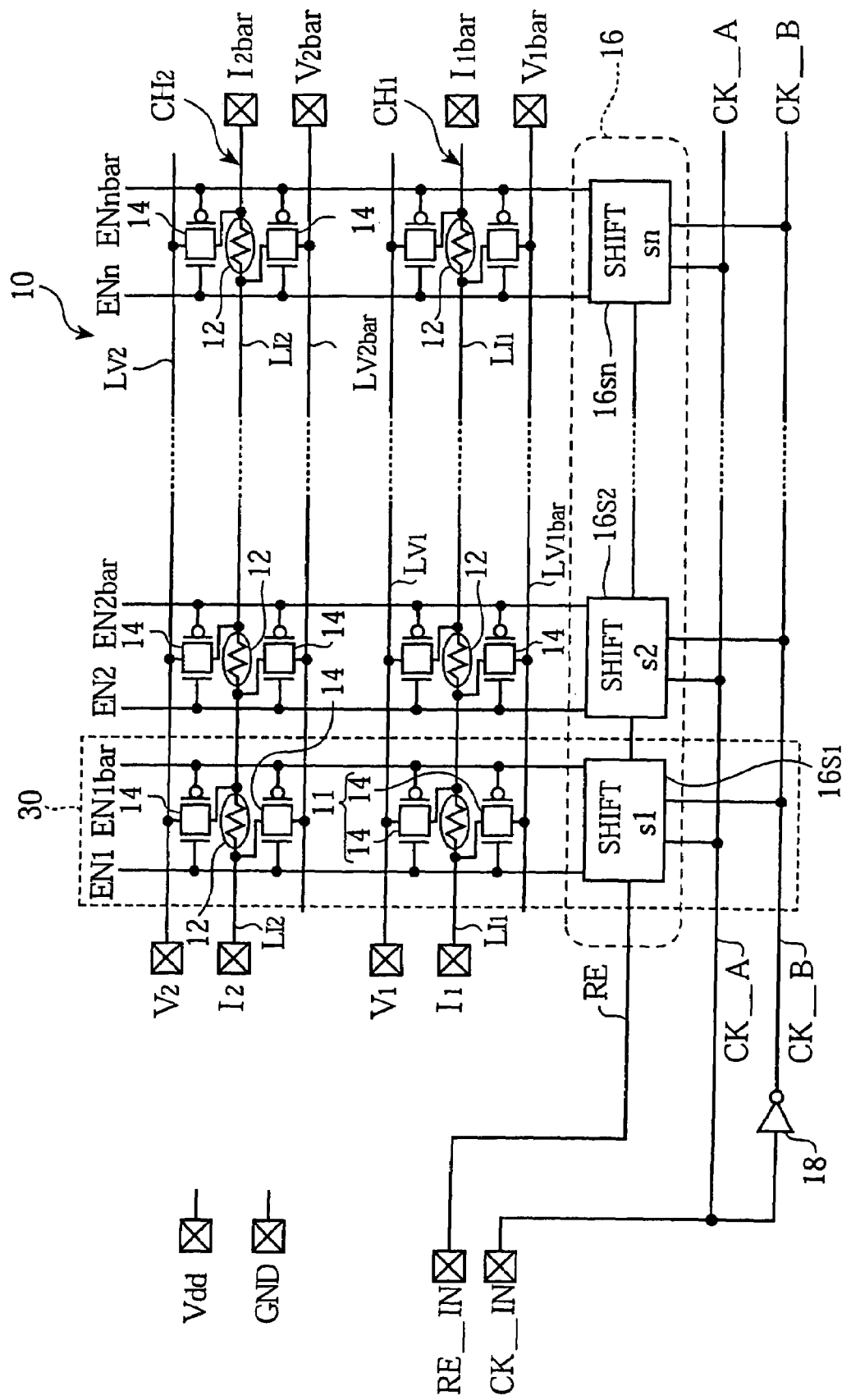
FIG. 1 is a block diagram of a test circuit according to a first embodiment of this invention for managing a fabrication process of semiconductor integrated circuits.

FIG. 1 is a circuit diagram illustrating the test circuit according to a first embodiment of this invention. The test circuit may be used to monitor, by way of example, a CMOS (Complementary Metal Oxide Semiconductor) process as the manufacturing process.

The test circuit 10 for monitoring a manufacturing process of semiconductor integrated circuits includes a plurality (2n elements are shown) of elements 12 to be tested, which are contacts or vias, indicated by resistance symbols; a plurality of switches 11; and a selection circuit. Each switch 11 is constructed with a pair of transmission gates 14 connected to the two ends of each element 12. Each transmission gate 14 is constructed with two pas-transistors, i.e., a PMOS transistor and an NMOS transistor. The selection circuit may be a shift register 16 having a plurality (n stages are shown) of shift stages (16S1 to 16Sn), which controls the transmission gates 14 at the two ends of the elements 12 so as to sequentially select at least one element 12 at a time.

Viewed differently, two elements 12, two pairs of transmission gates 14, and one stage 16sj of the selection circuit, which are vertically arranged in FIG. 1, constitute one unit 30. A plurality (n) of the units 30 is arranged in the horizontal direction in FIG. 1 to constitute the test circuit 10.

In the test circuit 10 shown in FIG. 1, the elements 12 are connected in series so as to form two rows of chains CHi (i=1, 2), in each of which n elements 12 are connected. The two ends of the chain CHi are connected to a current source pad Ii (i=1, 2) and a current drain pad Iibar, respectively.

Two ends of each element 12 are connected to a pair of potential measurement lines LVi and LVibar (i=1, 2) through the pair of transmission gates 14. In other words, potential measurement lines LVi and LVibar are provided commonly to a plurality (n) of elements 12 in the chain CHi. One end of each potential measurement line LVi is connected to a potential measurement pad Vi (i=1, 2), and one end of each potential measurement line LVibar is connected to a potential measurement pad Vibar (i=1, 2), which constitutes a pair with the potential measurement pad Vi.

Gates of the NMOS and PMOS transistors of the two transmission gates 14 are connected to a pair of enable lines ENj and ENjbar (j=1 to n), which extend from the corresponding stage 16Sj (j=1 to n) of the shift register 16. Each stage 16Sj (j=1 to n) of the shift register 16 is connected in parallel to clock lines CK_A and CK_B, which is an inverted signal of the CK_A. The clock line CK_A is directly connected to a clock input pad CK_IN for inputting a clock signal, while the clock line CK_B is connected to the clock input pad CK_IN through an inverter 18.

The shift register 16 is connected to a reset signal line RE leading to a reset signal pad RE_IN, so that each stage 16Sj of the shift register 16 can be put into an initial state by a reset signal from the reset signal line RE. As will be explained later, the clock signal and the reset signal are used as control signals to control the operation of the shift register 16.

In addition, in the test circuit 10, a power supply line and ground line (not shown) for the entire circuit are wired and are connected to a power supply pad Vdd and a ground pad GND, respectively.

In FIG. 1, by way of example, two chains CHi (i=1, 2) in which the elements 12, such as contacts or vias, are connected in series, are shown. In this case, different types of elements may be selected as the elements to be tested 12 for use in this invention. For example, contacts connected to $N^+$ diffusion regions, contacts connected to $P^+$ diffusion regions, vias connected between metal wiring layers may be selected. Alternatively, the same type of contacts or vias fabricated in different sizes may also be selected.

While, in the illustrated embodiment, the elements 12 are connected to provide two chains CH1 and CH2, they may be connected to provide one chain or three or more chains. The number n of the elements 12 connected to form the chain is not particularly limited, but a relatively large number can be selected, ranging from about one hundred to several hundreds, and/or about one hundred to two hundred.

When a direct current is supplied to the chain CHi (i=1, 2) in which the elements 12, such as contacts or vias, are connected in series, a potential difference is generated between both ends of each element 12. The potential difference is sent to the pair of potential measurement lines LVi and LVibar through the pair of transmission gates 14, and is externally measured through the potential measurement pads Vi and Vibar. The resistance value of the element 12 is then calculated by dividing the measured potential difference by the supplied direct current value.

That is, in the test circuit 10 shown in FIG. 1, Ii and Iibar pads are used as input pads to input an input signal to selected one of the elements. The Vi and Vibar pads are used as output paged to output an output signal from selected ones of elements.

In the illustrated embodiment, the potential measurement lines LVi and LVibar are commonly provided for all of the elements in each chain CHi. Therefore, the element 12 to be tested must be selected by one of the pairs of transmission gates 14. This selection is made as follows.

A clock signal input from the clock input pad CK_IN is used to generate two-phase clock signals of signal levels H (high) and L (low), which control the shift operation of the shift register 16.

At first, a reset signal is fed from a reset terminal to the shift register 16 so that only the leftmost stage 16S1 of the shift register 16 is set to H (high) state, and the other stages are set to L (low) state. Thereby putting the shift register 16 into an initial state. That is, the leftmost stage 16S1 of the shift register 16 is in a state in which data has been input, i.e., the enable line ENj is H (high) and the enable line ENjbar is L (low). At this point, all of the other stages are in a state in which no data is present, i.e., in a state in which the enable line ENj is L (low) and the enable line ENjbar is H (high). As a result, only the two pairs of transmission gates 14 arranged in the leftmost column in the FIG. 1 open.

Thereafter, each time the two-phase clock signal is input, data in the shift register 16 is shifted from the left stage, in the figure, to the right stages one by one. Thus, at a certain point, only two pairs of transmission gates 14 in a corresponding column open, so that potentials of both ends of two elements 12 are respectively sent on the potential measurement lines LVi and LVibar, for each chain CHi. In such a manner, each of the elements 12 in each chain CHi is sequentially selected and the resistance of the selected element is measured individually.

It is to be noted that this invention does not restrict the switches 11 to the transmission gates 14. Any element that can disconnect or connect both ends of the element 12 from or to the potential measurement lines LVi and LVibar may be used. That is, any kind of electrically controllable switch may be used.

In addition, the selection circuit is not limited to the shift register 16, and thus any circuit that can select one of the measurement elements 12 in each chain CHi (i=1, 2) may be used. Any selection circuit that is conventionally known can be used.

However, a shift register can be preferably used as the selection circuit. By using a shift register as the selection circuit, as shown in FIG. 1, a unit can be constructed with one or a predetermined number of elements to be tested, switches, and a part of the selection circuit to select the one or predetermined number of elements using the switches. That is, by using one of the stages 16si of the shift register 16 as the part of the selection circuit to select the elements in the unit, the same circuit configuration may be employed for each unit.

Additionally, the test circuit 10 of this invention may be provided with various elements and/or circuits that are necessary for the operation.

In essence, the test circuit of this invention is functionally configured as described above.

In addition, the test circuit 10 according to this embodiment of this invention is characterized in that it is physically placed within a scribe line. That is, the test circuit 10 is placed on a semiconductor substrate on which a plurality of chip areas for placing semiconductor integrated circuit chips and stripe-shaped scribe lines between the chip areas are formed. The test circuit 10 is placed within the scribe line.

Figure 2:
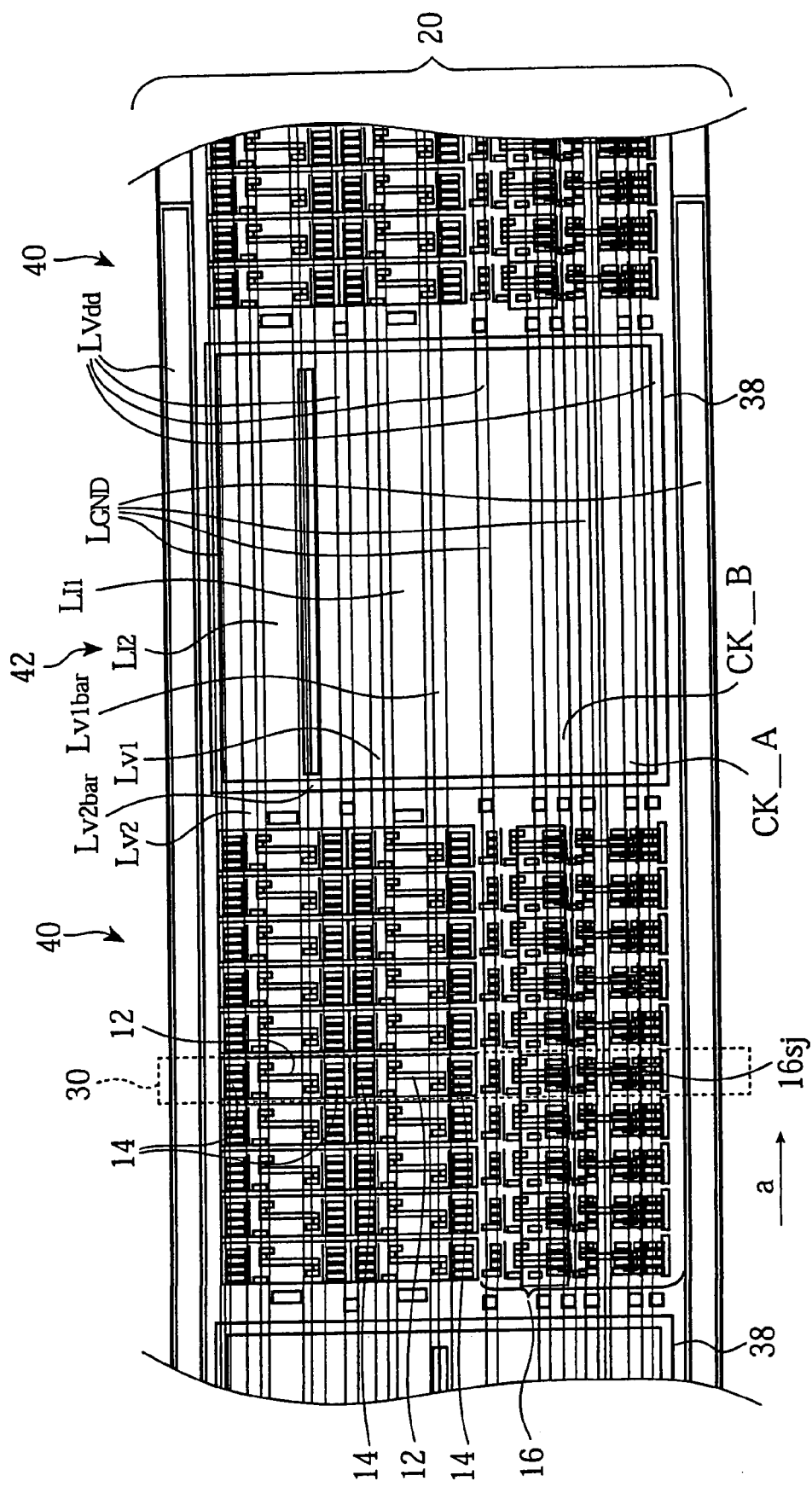
FIG. 2 is a layout schematically illustrating part of test circuit blocks and wiring blocks of the test circuit shown in FIG. 1.

FIG. 2 shows a physical layout of a part of the test circuit 10 shown in FIG. 1. The layout shown in FIG. 2 includes two test circuit blocks 40 and a wiring block 42 arranged within a scribe line 20.

FIGS. 3A and 3B shows a physical layout of a part of the test circuit 10 shown in FIG. 1. As shown by FIG. 3C, the right end of FIG. 3A is connected to the left end of FIG. 3B. As shown in FIGS. 3A and 3B, a plurality of test circuit blocks 40 and wiring blocks 42 are arranged within a scribe line 20 along a longitudinal direction of the scribe line 20.

In FIG. 2, circuit elements within the unit 30 shown in the circuit diagram are arranged in one direction, in the same manner shown in the circuit diagram of FIG. 1. That is, one stage 16Sj of the shift register 16, two pairs of transmission gates 14, and two elements 12 to be selected by the stage 16Sj using the two pairs of transmission gates 14 are arranged in a direction generally perpendicular to the longitudinal direction (indicated by the arrow a) of a scribe line 20, i.e., in the vertical direction in FIG. 2, to form one unit 30. The physical dimension of the unit 30 in the vertical direction is sufficiently small such that the unit can be placed within the width of the scribe line 20.

In the illustrated test circuit 10, ten (10) units 30 are arranged in the horizontal direction, i.e., in the longitudinal direction of the scribe line 20, to constitute one test circuit block 40.

The elements to be tested 12 such as contacts or vias in the units 30 are interconnected by metal wires at the boundaries between adjacent units 30 to constitute the contact or via chains (the chains CH1 and CH2). The chain serves as a current path for measuring a potential between both ends of each element 12.

As shown in FIGS. 3A and 3B, a plurality of pads 38 are provided within the scribe line 20 at substantially regular intervals in the longitudinal direction of the scribe line 20. A plurality of test circuit blocks 40 configured in the manner described above are arranged in the spaces between the test pads 38. That is, the circuit blocks 40 and the test pads 38 are alternatively arranged linearly within the longitudinal direction of the scribe line 20. Thus, the test circuit blocks 40 are advantageously arranged between the pads 38 to reduce the area of the entire test circuit 10 including the pads 38.

Additionally, the test circuit blocks 40 may also be arranged outside of the test pads 38, i.e., on the right of the right-most pad and/or on the left of the left-most pad in the column in which the test pads 38 are arranged in the longitudinal direction.

It may be possible to arrange all the units 30 in one block 40 depending on the number of required units. If, however, all the units 30 cannot be arranged in a space between two adjacent test pads 38, the units 30 can be arranged in a plurality of blocks 40. That is, the number of units 30 that fit between the adjacent test pads 38 are arranged in each test circuit block 40.

To facilitate probing with probes and for ease of design, the test pads 38 are arranged with the same interval. That is, spaces between the pads 38 are set to be substantially the same. However, the spaces can also be set to be differently.

The potential measurement lines LVi and LVibar that are provided for each element 12 in the circuit block 40 linearly extend across the pad 38 in the longitudinal direction within the scribe line 20. Similarly, current feed lines Lli (by which the elements 12 are connected in series to form the chain CHi) that serve as current paths, power supply lines LVdd, and ground line LGND are linearly arranged across the pads 38 in the longitudinal direction within the scribe line 20. These wiring lines run beneath the pads 38 that do not have to be connected to, and are connected through vias to the pads that need to be connected.

Thereby, a wiring block 42 including a pad 38 and wiring lines running across the pad 38 is formed. As shown in FIGS. 3A and 3B, in the test circuit 10, a plurality of test circuit blocks 40 (in the illustrated example, four test circuit blocks are shown) is connected via wiring blocks 42. As shown in FIG. 2, these wiring blocks 42 are fitted within the width of the scribe line 20.

Thus, the elements 12 to be tested (e.g., contacts or vias), the switches 11 (e.g., the pair of transmission gates 14), and a part of the selection circuit (e.g., a stage 16si of a shift register 16) are arranged as a unit 30 in a first direction (the vertical direction). A plurality of such units 30 is arranged in a second direction (the horizontal direction), which is generally perpendicular to the first direction, to provide a test circuit block 40. The test circuit block 40 has an appropriate size that can be fitted within the space between the test pads 38. A plurality of test circuit blocks 40 are arranged alternately with the wiring blocks 42 in the second direction within the scribe line 20.

This arrangement can provide a test circuit 10 including test pads 38 physically elongated in the second direction and can be fitted within an elongated scribe line 20. This configuration of the units 30 and test circuit blocks 40 facilitates quick adjustment of the number of elements 12 in each chain (the number of stages of the chain CHi) as required.

While not shown in the circuit diagram of FIG. 1, various elements that are required for testing the test circuit 10 can also be configured as blocks 44 and 46 (see FIG. 3A) so as to be fitted within the scribe line 20.

The test circuit according to the embodiment of this invention is essentially configured as described above. Measuring the resistance values of the elements 12 in the chain CHi using the test circuit 10 shown in FIGS. 1, 2, 3A, and 3B makes it possible to detect defects or abnormalities, such as an increase in resistance, that occurs in a small fraction of the elements 12.

Figure 4A:
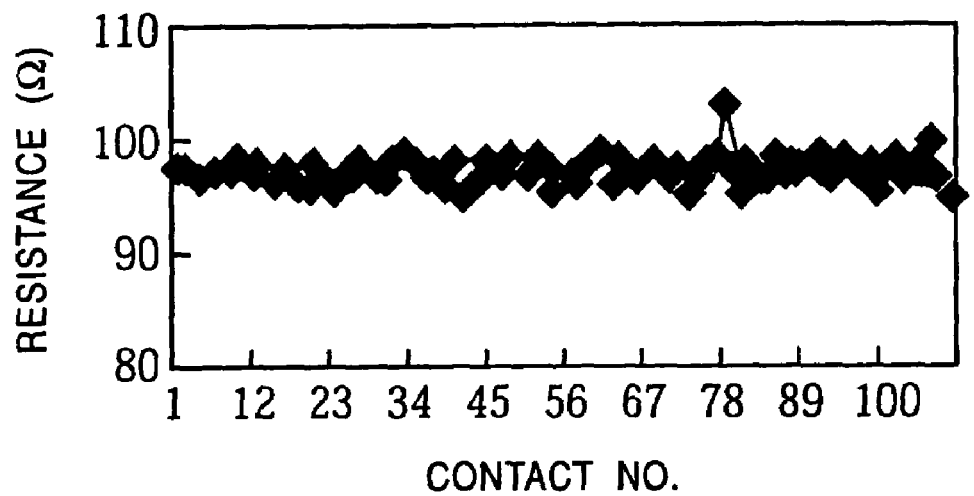
FIGS. 4A and 4B are graphs, respectively, showing the result obtained by measuring the resistance of individual contacts in a contact chain according to the test circuit of this invention.
Figure 4B:
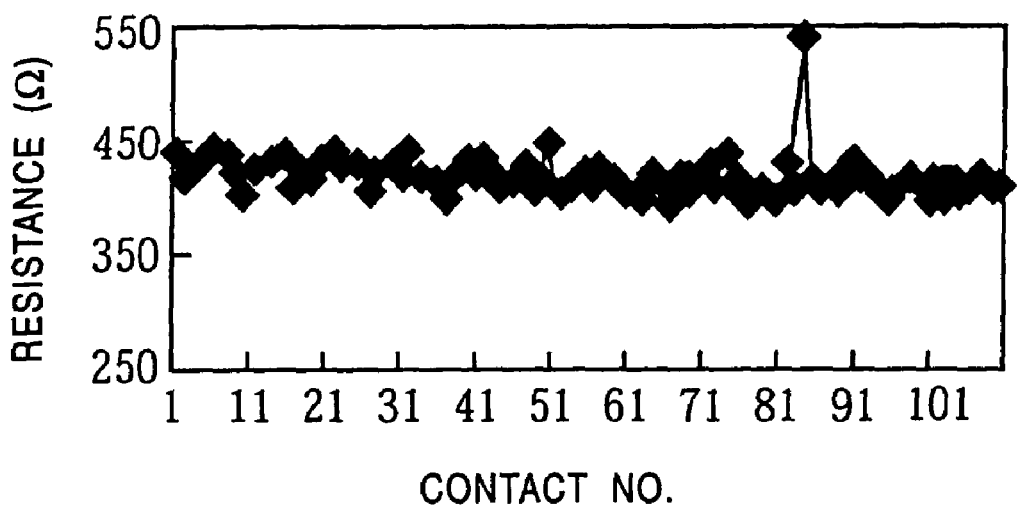

FIGS. 4A and 4B show the results of measuring of the contact resistance of each contact in the chain CHi (i=1, 2) of the test circuit 10. In this example, the test circuit 10 was fabricated so as to include two types of contacts, i.e., 104 contacts to $N^+$ diffusion regions and 104 contacts to $P^+$ diffusion regions. Each contact has a size of 0.4 µm. The test circuit 10, thus fabricated, in this example, has a size of 98 µm×2,400 µm, and was fitted within the scribe line 20 having a width of 100 µm.

FIGS. 4A and 4B show the test results for the contacts to the $N^+$ diffusion regions and to the $P^+$ diffusion regions, respectively. The numbers on the horizontal axes in FIGS. 4A and 4B indicate the stage in the contact chain, and the vertical axes indicate the contact resistance values ($\Omega$).

As shown in FIGS. 4A and 4B, most of the contacts in each chain have substantially the same resistance within a normal range of variation. However, one of the contacts in each chain has a significantly higher resistance compared with other contacts. Thus, the test circuit 10 of this invention can be used to detect a defect even in the case in which an increase in resistance occurs only in a small fraction of the contacts while the majority of them are normal.

The detection of such a defect or an abnormality makes it possible to issue an alarm prior to an occurrence of an actual product defect in a manufacturing process. When the alarm is issued, it is possible to examine and adjust the manufacturing process to prevent the actual occurrence of the defect in the manufactured semiconductor integrated circuit product chips. That is, the manufacturing process can be effectively monitored by providing the test circuit 10 in the scribe line of the product wafers and by testing the test circuit 10 when the wafer process is completed. Thereby, the occurrence of defects that cause a low yield of the product chips can be prevented.

Alternatively, the test circuit 10 can be provided in the scribe line and tested at the time of occurrence of a defect causing a decrease in yield of the product chips. Testing the test circuit 10 facilitates the identification of a defective point, and the cause of the defect in the manufacturing process can be made clear.

That is, as shown in FIGS. 4A and 4B, the defective element having an abnormal characteristic can be electrically identified. And the physical location of the defective element can be easily identified, because the elements 12 are physically arranged in a plurality of block groups 40 in the longitudinal direction in the scribe line 20. The identified element can be closely analyzed by, for example, SEM (scanning electron microscope) or TEM (transmission electron microscope).

In the method for monitoring a manufacturing process of semiconductor integrated circuits according to this invention, semiconductor integrated circuit chips are formed in a plurality of chip areas on the surface of a semiconductor wafer. The test circuit 10 is simultaneously formed in the scribe line 20 between the chip areas. The test circuit 10 is tested when, for example, the wafer process is completed.

In the testing of the test circuit 10, the shift register 16 sequentially selects one or more of the elements 12, such as contacts or vias, in the chain at a time, and characteristics of the elements 12, such as resistance values of the contacts or vias, are measured. Thus, by analyzing the results of the testing, an occurrence of an abnormality, such as an increase in resistance in a small fraction of the elements 12 can be detected.

Therefore, the production process can be continuously monitored and abnormalities of the production process can be detected before an occurrence of the defect, or low yield of the actual semiconductor integrated circuit product chips, manufactured by the manufacturing process.

An operator can make the determination as to whether the test circuit has an abnormality. Alternatively, according to this embodiment, a test system (configured with a prober, tester, controlling computer, and so on) can automatically issue a warning. That is, a reference value and a permissible range are set in the test system and the system issues the warning when a test result that exceeds the permissible range is obtained.

The warning can be displayed on a display screen to help the operator make a decision. Further, the warning can be automatically added to the record of the test result. Alternatively, the warning may be automatically transmitted, for example, in the form of an electronic mail, to an operation manager.

In addition, a specific process step that could be a cause for the abnormality may be set depending on the type of the test circuit and the mode of the abnormality and can be stored in the system in advance. Upon detection of an abnormality, the test system may automatically issue a warning to request that the operation manager check and adjust the specific process step. The system may also automatically terminate the operation of the specific process.

Alternatively, the permissible range may be set into two stages. When a first-phase permissible range is exceeded, a warning is issued to the operation manager. When a second-phase permissible range is exceeded, the set process is automatically terminated.

Even when the measurement result obtained falls within a range in which an immediate measure is not needed, the result could be stored in the test system or in a system managing the manufacturing process. With this arrangement, a report indicating the trend of test results can be created in response to a request by the operation manager or automatically at regular intervals. The report can be sent from the test system (or from the process management system) to the operation manager to ask whether the state of the process needs to be checked or not.

As explained above, by providing the test circuit 10 on the product wafers and by testing the test circuit 10, it is possible to detect abnormalities that occur in a small fraction of the elements. Thereby, a warning can be issued before a decrease in the production yield becomes manifest. The test result can additionally be used to adjust the production process.

The test circuit 10 according to this invention may also be advantageously used in monitoring a so-called "flexible manufacturing" facility in which multiple types of semiconductor integrated circuit products are manufactured with varying ratios and sequences depending on the demand of the product.

The types of the products may include products in different categories, such as memory, logic and analog semiconductor integrated circuit products. The types of the products may also include products in the same category with different specifications. For example, when the manufacturing process is used to manufacture ASIC (Application Specific Integrated Circuit) products, the types of products mainly include logic products with different specifications.

The flexible manufacturing facility manufactures various types of semiconductor product wafers having respective types of semiconductor integrated circuit product chips in their chip areas. Sizes of the chip areas in these product wafers vary depending on the types of the semiconductor integrated circuit products.

However, all of the types of semiconductor product wafers have scribe lines between the chip areas and the widths of the scribe lines can be made the same or substantially the same. Therefore, the same test circuits 10 can be commonly placed within the scribe lines 20 of all or at least some of the types of semiconductor product wafers.

This arrangement enables sequential and coherent gathering of test data and monitoring of the manufacturing process even when the types of products to be manufactured vary. For example, even when a specific type of product is not manufactured for a certain period, the same test circuits provided in scribe lines 20 on different type of semiconductor product wafers can be tested to monitor the manufacturing process.

Thus, the feature of the test circuit 10 of this invention, i.e., the capability of detecting abnormalities in individual elements 12 among a large number of elements 12, is utilized to detect an abnormality in the flexible manufacturing process at an early stage. That is, the abnormality in the elements 12 in the test circuit can be detected before a decrease in the yield of one or some of the types of product chips occur.

Different types of defects may have a different influence on the yield of different types of product chips. When a manufacturing process is mainly used to manufacture a first type of product chip that is not strongly influenced by a type of defect, an average yield of the product chip may be kept high even if a density of that type of defect becomes high. Therefore, the operation manager may not recognize the necessity of adjusting the manufacturing process. If the same manufacturing process with the high density of the type of defect is used to manufacture a second type of product chip that is strongly influenced by the type of defect, however, the yield of the second type of product chip likely to be very low.

On the other hand, if test circuits that are sensitive to that type of defect are provided on the product wafers for forming a first type of product chip, the increase of the defect would be detected. Then, the manager could recognize the necessity of the adjustment even before starting the manufacturing of the second type of product. Thus, occurrence of a low yield of the second type of product chip could be prevented.

The test circuit 10 of the present invention can also advantageously be used to monitor a manufacturing process used to manufacture various types of semiconductor product wafers at an arbitrary ratio in an arbitrary order.

In this case, at least two types of the product wafers having the common test circuit 10 in their scribe lines 20 are selected from the various types of product wafers. The test circuits 10 in the selected product wafers are tested to detect an abnormality in the elements 12 in the common test circuits 10. Thus, even when the various types of semiconductor integrated circuit product chips are manufactured at an arbitrary ratio and in an arbitrary order, an abnormality in the manufacturing process can be detected at an early stage.

The semiconductor product wafers to be tested may be selected such that intervals between the times of manufacture of the wafers are substantially the same. Thereby, the state of the manufacturing process is constantly monitored with substantially the same interval using the common test circuit 10 even when the types of the products manufactured by the process vary arbitrary.

In the manufacturing of semiconductor integrated circuits, a plurality of wafers are grouped into a lot and processed together. Usually, the same type of semiconductor integrate circuit chips are formed using the same mask in each of the chip areas on each of the wafers in the lot. Thereby, a large number of the same type of semiconductor integrated circuit product chips are produced simultaneously.

Therefore, the selection of the at least two types of product wafers actually selects at least two lots of the wafers. One or some of the wafers in the selected lots are further selected and the test circuits 10 on the selected wafers are tested. Usually, the test circuit 10 is formed in the scribe line simultaneously with the product chip in the chip area using a common reticle having mask patterns for both the product chip and the test circuit 10. Therefore, a large number of test circuits 10 are formed on each product wafer.

It is not necessary to test all of the test circuits 10 formed on the selected product wafer. Only some of the test circuits in predetermined positions (e.g., center, top, bottom, right, left) on the wafer can be tested.

Recently, a foundry service is widely used in which upon receipt of orders from various clients, semiconductor integrated circuit product chips are manufactured for respective clients. In the foundry service, the chip areas on the semiconductor wafer are allocated for the clients. That is, the manufacturer manufactures semiconductor product chips for the client in the chip areas on the wafers using the mask data provided by the client. Therefore, the manufacturer cannot utilize the chip areas to form test circuits for monitoring the manufacturing process.

Even in this case, according to this invention, the manufacturer can provide the common test circuit, designed or selected by the manufacturer, in scribe lines of the wafers. The manufacturer can utilize the test circuit to monitor the manufacturing process.

The client may also utilize the test circuit provided by the manufacturer. That is, the client may monitor the state of the manufacturing process of the manufacturer by testing the test circuit. The client may request the manufacture to check or adjust the process when an abnormal test result is obtained.

Further, the client may also request the manufacturer to provide a test circuit selected by the client on the wafer manufactured for the client. When utilizing multiple manufacturers, the client may gather consistent monitoring data about the states of the process of the multiple manufacturers by requesting the manufactures to provide common test circuits on the product wafers.

As explained above, the test data may be stored in the test system or in the manufacturing management system.

When an abnormal test result is obtained, or when a decrease in a yield of a certain type of product chips occurs, the test results obtained from the common test circuit on the previously manufactured product wafers stored in the test system or in the management system can be analyzed in detail. Even when the low yield occurs in a product that was not manufactured for a certain period, a coherent analysis can be made. That is, the analysis can be made using the stored test results including those obtained from the common test circuits formed on different types of product wafers during the period when the product chips with the low yield was not manufactured.

Further, when the abnormality occur in one type of product, detailed analysis using, for example, SEM and TEM, can also be made on the common test circuits on the other types of product wafers. Such analyses using the common test circuit are highly effective to specify the cause of the abnormality.

As explained above, the test circuit 10 according to this invention may advantageously be used for monitoring a manufacturing process used for manufacturing multiple types of semiconductor product wafers. The test circuit 10 according to this invention may also advantageously be used for analyzing the cause of an abnormality in the manufacturing process used for manufacturing multiple types of semiconductor product wafers.

The test circuit 10 can be provided with varying sizes or types of the elements 12, such as contacts or vias. Analysis of such test circuit 10 enables identification of a defective point, and further clarifies the cause of the defect in the manufacturing process.

The above description focuses on the case in which the test circuit 10 is provided in a scribe line 20. However, the detection of an abnormality occurring in a fraction of the elements 12 of the test circuit 10 that can be equally achieved in a case in which the test circuit is provided in a chip area.

By detecting the abnormality in the fraction of the elements 12, the manufacturing can be adjusted to correct the abnormality. Thereby, occurrence of an abnormality in the actual product chips can be prevented and a stable operation of the manufacturing process can be achieved.

In this case, it is possible to use the test circuit 10 having the configuration and layout as shown in FIGS. 1, 2, 3A, and 3B. That is, one or a certain number of elements 12 to be tested, switches 11, and the part of the selection circuit to select the elements 12 using the switches 11 are arranged in the first direction to form one unit 30. A plurality of the units 30 is arranged in the second direction generally perpendicular to the first direction to form one block 40 having an appropriate size. A plurality of the blocks 40 are is alternately arranged with the test pads 38 in the second direction to constitute the elongated test circuit 10. This arrangement is advantageous to reduce the area required to place the test circuit 10 including the pads 38.

The test circuit 10 and method of monitoring a manufacturing process of semiconductor integrated circuits have been described in detail in conjunction with various aspects of this invention. However, this invention is not limited to those specific aspects described. Various improvements or design changes may naturally be made thereto without departing from the scope or spirit of this invention.

In the test circuit 10 shown in FIG. 1, a plurality of elements 12 to be tested is connected in series to form a chain. It is also possible to construct a test circuit by connecting a plurality of elements to be tested in parallel such as shown in U.S. Pat. No. 5,485,095, which is hereby incorporated by reference in its entirety.

In the test circuit 10 shown in FIG. 1, resistor elements such as contacts or vias are used as the elements to be tested. Various elements other than contacts and vias, however, may be also used as the elements to be tested in the test circuit.

For example, a memory such as SRAM including a plurality of memory cells, as elements to be tested, and row- and column decoders as a selection circuit to sequentially select each of the memory cells, may be used as a test circuit. When the design rule of the manufacturing process is small enough, it is possible to place in a scribe line a memory with a number of memory cells sufficient to detect defects that occur in a small fraction of the memory cells.

For example, using a 0.18 μm design rule manufacturing process, an SRAM having about 1 K bits memory cells including the selection circuit and switches may be easily placed within a scribe line. That is, by dividing the 1 K bits SRAM into two blocks, each of the blocks can be placed between two adjacent pads with a space of 60 μm between them within a scribe line having a width of 100 μm. The selection circuit and switches to select each of the cells within each block can also be placed between the adjacent pads within the scribe line.

Further, by dividing the memory into more than two blocks, or by using a smaller design rule manufacturing process, a memory having more than 1 K bits cells may be placed within a scribe line. It is also possible to place, for example, a test pattern generation circuit such as shown in U.S. Pat. No. 5,485,095, which is hereby incorporated by reference in its entirety, within the scribe line.

It is possible to make the test circuit highly sensitive to certain types of defects by, for example, intentionally shifting an alignment between certain layers, making a dimension of a certain portion in the memory cell smaller than the standard size, and so on.

When the semiconductor product chip or at least some of the different types of the semiconductor product chips include an analogy circuit, a precise matching of transistor characteristics are higher required to achieve a high yield in the product chip. The matching of transistor characteristics may be evaluated by, for example, evaluating characteristics of analog amplifiers such as differential amplifies.

Figure 5:
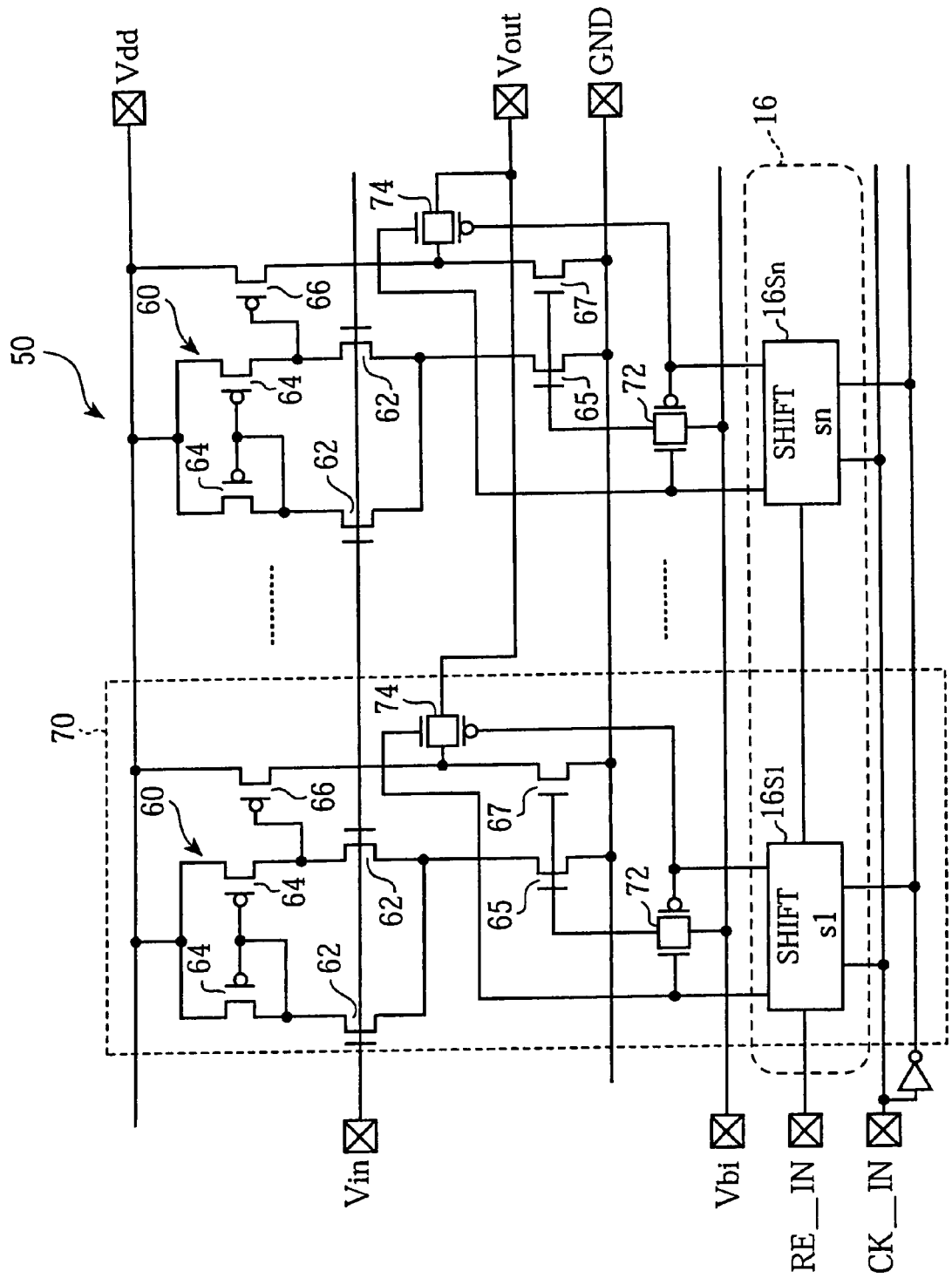
FIG. 5 shows a circuit diagram of a test circuit including differential amplifiers as the elements to be tested in a second embodiment according to the invention.

FIG. 5 shows a circuit diagram illustrating the test circuit according to a second embodiment of this invention including differential amplifiers as elements to be tested.

The test circuit 50 shown in FIG. 5 includes n differential amplifiers 60 as elements to be tested. In the test circuit 50, similar to the test circuit 10 shown in FIG. 1, each of the elements to be tested (a differential amplifier 60), switches (transmission gates 72 and 74), and a part of a selection circuit (a shift stage 16sj of a shift register) that selects the elements using the switch forms a unit 70.

Each of the differential amplifiers 60 includes a pair of NMOS transistors 62. Sources of the NMOS transistors 62 are coupled and connected to the drain of another NMOS transistor 65. The source of the NMOS transistor 65 is connected to GND. Gates of the pair of NMOS transistors 62 forms input terminals of the differential amplifier 60. Drains of the NMOS transistors 62 are connected to drains of respective one of a pair of PMOS transistors 64. Sources of the pair of PMOS transistors 64 are connected to Vdd. Gates of the pair of PMOS transistors 64 are coupled and connected to the drain of one of the pair of NMOS transistors 62, thereby the pair of PMOS transistors 64 operates as a current mirror.

The drain of another one of the pair of NMOS transistors 62 is connected to the gate of PMOS transistor 66. The source of the PMOS transistor 66 is connected to Vdd. The drain of the PMOS transistor 66 is connected to the drain of an NMOS transistor 67 to form an output terminal of the differential amplifier 60. The source of the NMOS transistor 67 is connected to GND.

An input voltage is input as an input signal from an voltage input pad Vin, and is supplied to both of the input terminals of each of the differential amplifiers 60.

One of the transmission gates 72 in each unit 70 of the test circuit 50 supplies, when the unit is selected by the shift stage 16sj, bias voltage to gates of NMOS transistors 65 and 67 in the unit. The bias voltage is input from a bias voltage input pad Vbi. Thereby, the differential amplifier 60 in the selected unit 70, which is a selected element to be tested, operates. Because the common input voltage is supplied to the both of the input terminals of the differential amplifier 60, the output voltage output from the drain of the PMOS transistor 66 indicates a degree of matching of the pair of NMOS transistors 62.

Another transmission gate 74 in each unit 70 transmits the output voltage of the differential amplifier, as an output signal of the test circuit 50, to an output pad Vout. Thereby, the degree of matching of the pair of NMOS transistors 62 in each of the differential amplifiers 60 can be evaluated by sequentially selecting one of the units 70 and measuring the output voltage output from the output pad Vout.

Figure 6:
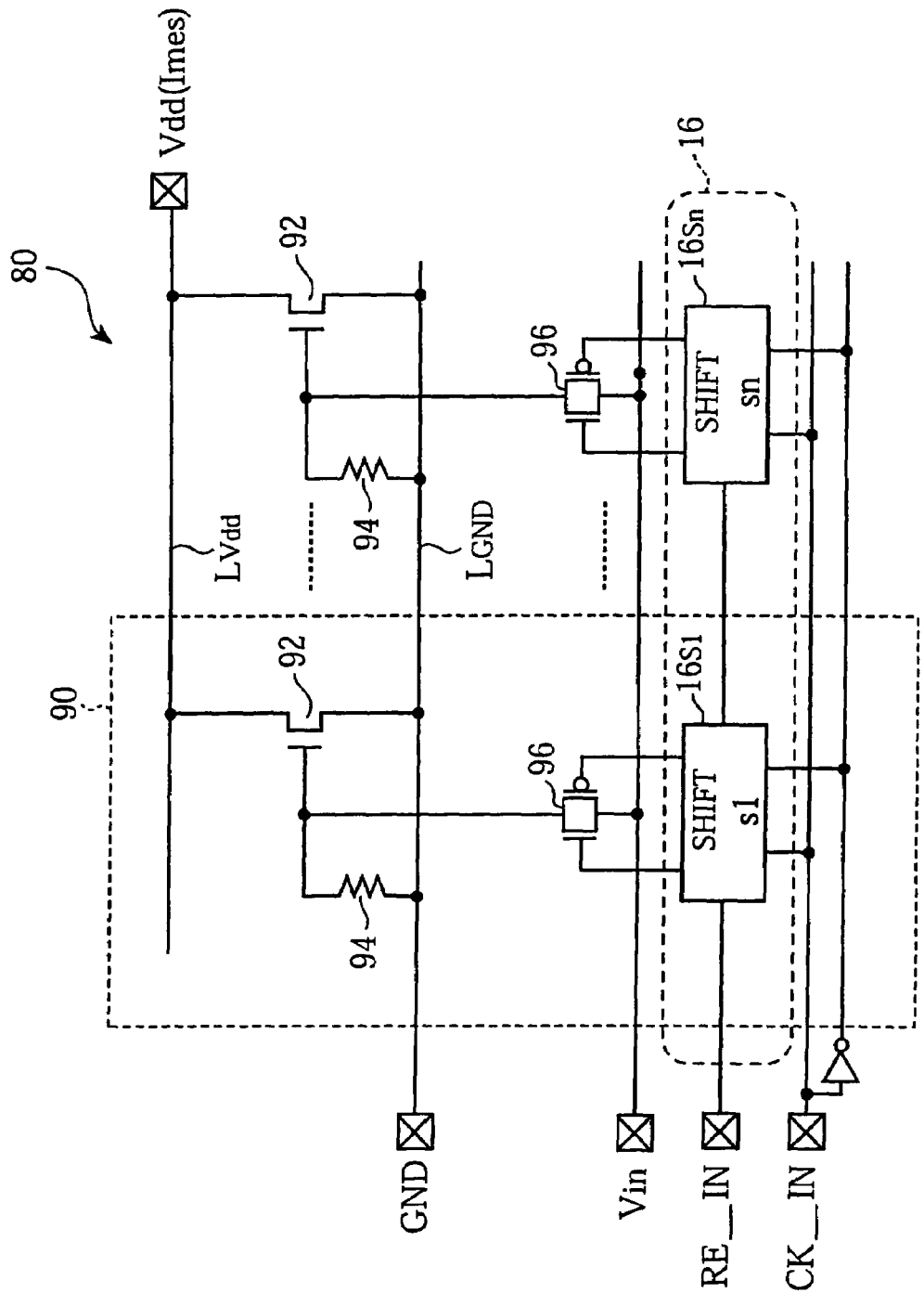
FIG. 6 shows a circuit diagram of a test circuit including transistors as the elements to be tested in a third embodiment according to the invention.
Figure 7A:
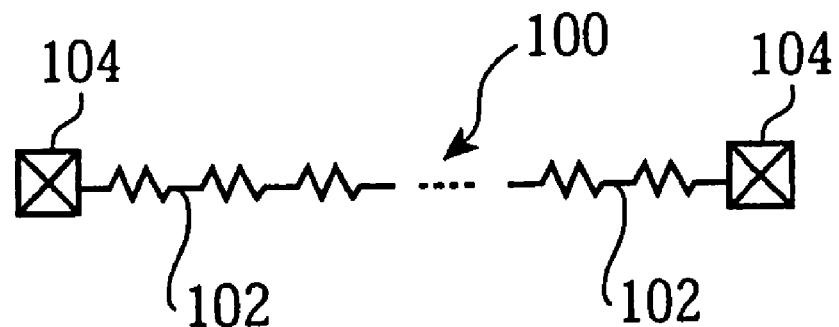
FIGS. 7A and 7B are circuit diagrams of the first and the second conventional test circuits, respectively.
Figure 7B:
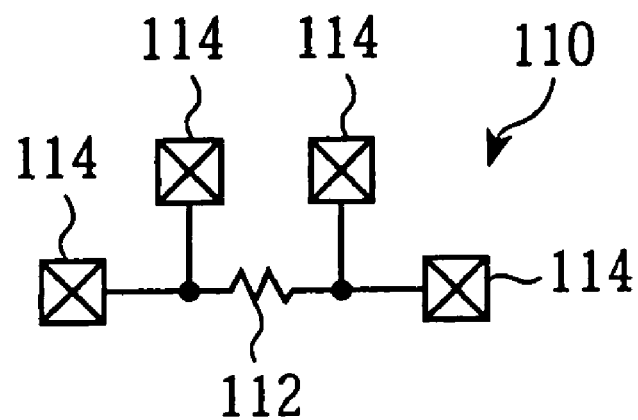

The matching of transistor characteristics may also be evaluated by directly measuring each of transistors selected from a plurality of transistors by using a test circuit such as shown in FIG. 6.

FIG. 6 shows a circuit diagram illustrating the test circuit 80 according to a third embodiment of this invention including a plurality of transistors 92 as elements to be tested. In the test circuit 80 shown in FIG. 6, the plurality of NMOS transistors 92 are connected in parallel between a power supply line LVdd and a ground line LGND. The power supply line LVdd is connected to a power supply pad Vdd, and the ground line LGND is connected to a ground pad GND. The power supply pad Vdd is also used as a current measurement pad Imes. That is, the current flows into the Vdd (Imes) pad is measured as an output signal of the test circuit 80.

Similar to the test circuits 10 and 50, the test circuit 80 is organized in a plurality of units 90 each including one of the NMOS transistors 92 as an element to be tested, a switch (a transmission gate 96) and a part of a selection circuit (shift stage 16sj of a shift resistor 16) that selects the NMOS transistor using the switch. Each of the units also includes a resister 94 connected between the gate of the NMOS transistor 92 and the ground line LGND.

An input voltage is input as an input signal to an input voltage pad Vin, and the transmission gate 96 in the selected one of the units 90 supplies the input voltage to the gate of the NMOS transistor 92 in the units 90. Thereby, the selected one of the NMOS transistors 92 becomes ON. While the other NMOS transistors 92 are OFF because the resistors 94 keep the gates of the other NMOS transistors at the GND potential. Therefore, the drain current of the selected one of the NMOS transistors 92 flows into the Vdd (Imes) pad.

By sequentially selecting one of the plurality of transistors 92 at a time by the shift resistor 16, and by measuring the drain current of selected one of the transistors 92, a distribution of drain current at a fixed gate voltage can be evaluated. Thereby matching of the transistor characteristics can be evaluated.

The test circuits 50 and 80 may also be physically arranged in a scribe line similar to the case of the test circuit 10. That is, the element to be tested, the switch(es) and the part of the selection circuit in each unit are arranged in the first direction. A plurality of units is arranged in the second direction generally perpendicular to the first direction to form one circuit block having an appropriate size. And a plurality of the circuit blocks is alternately arranged with the pads in the second direction to construct an elongated test circuit that fit to the scribe line. Thereby, test circuits 50 and 80 including one hundred or more elements to be tested (differential amplifiers of transistors) can be placed within a scribe line having a width of, for example, 100 μm.

As described above, the test circuit according to this invention enables detection of an abnormality that occurs in a fraction of elements to be tested. Therefore, the test circuit may detect the abnormality before a decrease in a yield of the product chips occurs. Further, the test circuit can be placed within a scribe line between chip areas. Therefore, the test circuit does not waste the region that is intended to be allocated to product chips. As a result, the test circuit can be used to monitor a manufacturing process.

In the method of monitoring a manufacturing process according to this invention, it is possible to issue a warning before a decrease in a yield of product chips becomes manifest. Particularly, in a flexible manufacturing or foundry service, providing the same test circuit commonly on different types of semiconductor product wafers for manufacturing different types of product chips allows sequential and coherent monitoring of the manufacturing process.

In addition, the test circuit according to this invention is also advantageously used to identify a cause of a defect or abnormality when a low yield occurs in the product chips.

What is claimed is:

1. A method of monitoring a manufacturing process for manufacturing semiconductor product wafer, comprising:
    manufacturing semiconductor product wafers including different types of semiconductor product wafers at an arbitrary ratio in an arbitrary order by the manufacturing process, each of the different types of semiconductor product wafers comprising:
        a plurality of one of different types of product chips placed in respective chip areas arranged on a surface of the semiconductor product wafer; and
        a common test circuit placed within one of scribe lines between the chip areas, the common test circuit comprising a plurality of elements to be tested and a selection circuit that sequentially selects at least one of the elements at a time;
    selecting a plurality of the manufactured semiconductor product wafers comprising at least two of the different types of the semiconductor product wafers;
    testing each of the elements in the test circuit in the selected semiconductor product wafers; and
    evaluating results of the testing to monitor the manufacturing process.

2. The method according to claim 1, wherein a number of elements included in the test circuit are sufficiently large to detect a change of a state of the manufacturing process before a decrease in a yield of the different types of product chips occurs.

3. The method according to claim 1, wherein the evaluating step is performed when a decrease in a yield of at least one of the different types of product chips occurs.

4. The method according to claim 1, further comprising:
    adjusting the manufacturing process according to a result of the evaluating to prevent occurrence of a decrease in a yield of at least one of the different types of product chips.

5. The method according to claim 1, wherein the plurality of manufactured semiconductor product wafers are selected such that the selected semiconductor product wafers are manufactured with approximately a fixed interval.

6. The method according to claim 1, wherein different customers provide mask patterns used to manufacture the different types of product chips.

* * * * *